(12) United States Patent
Montero et al.

(10) Patent No.: US 10,928,451 B2
(45) Date of Patent: Feb. 23, 2021

(54) INFORMATION HANDLING SYSTEM OPTIONAL COMPONENT DETECTION AND MANAGEMENT

(71) Applicant: Dell Products L.P., Round Rock, TX (US)

(72) Inventors: Adolfo S. Montero, Pflugerville, TX (US); Randall E. Juenger, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 284 days.

(21) Appl. No.: 16/131,313

(22) Filed: Sep. 14, 2018

(65) Prior Publication Data

US 2020/0088793 A1 Mar. 19, 2020

(51) Int. Cl.
*G01R 31/34* (2020.01)

(52) U.S. Cl.
CPC .................................. *G01R 31/34* (2013.01)

(58) Field of Classification Search
CPC ..... G01R 31/34; G06F 1/206; F04D 25/0613; F04D 27/004
See application file for complete search history.

(56) References Cited

U.S. PATENT DOCUMENTS

| | | | |
|---|---|---|---|
| 5,600,841 A | 2/1997 | Culbert | |
| 6,948,020 B1 | 9/2005 | Bonomo et al. | |
| 7,075,586 B2 | 7/2006 | McIntyre | |
| 7,685,329 B1 | 3/2010 | Silvertsen | |
| 8,078,770 B1 | 12/2011 | Sivertsen | |
| 8,850,097 B2 | 9/2014 | Chin et al. | |
| 2006/0013571 A1* | 1/2006 | Squibb | H05K 7/20209 388/804 |
| 2008/0095521 A1* | 4/2008 | Chen | H02P 7/29 388/829 |
| 2010/0035461 A1 | 2/2010 | Berke | |
| 2012/0274252 A1* | 11/2012 | He | H02P 1/04 318/430 |

OTHER PUBLICATIONS

Mary Burke, Why and How to Control Fan Speed for Cooling Electronic Equipment, Feb. 2004, Analog Dialogue 38-02, 3 pp. (Year: 2004).*

* cited by examiner

*Primary Examiner* — Toan M Le
(74) *Attorney, Agent, or Firm* — Zagorin Cave LLP; Robert W. Holland

(57) ABSTRACT

A feedback line to an embedded controller from a component that intermittently sends data not distinguishable by the embedded controller initiates an error if data expected at the embedded controller is not distinguishable, such as with low cooling fan speed tachometer feedback. The embedded controller has a resistor divider circuit associated with the component that provides a high or low pin value at the embedded circuit based upon whether a component interfaces with a pin, such as a pulse width modulation output. The embedded controller checks for presence of the component in the absence of feedback as a reference to know whether an error exists relating to component feedback.

20 Claims, 2 Drawing Sheets

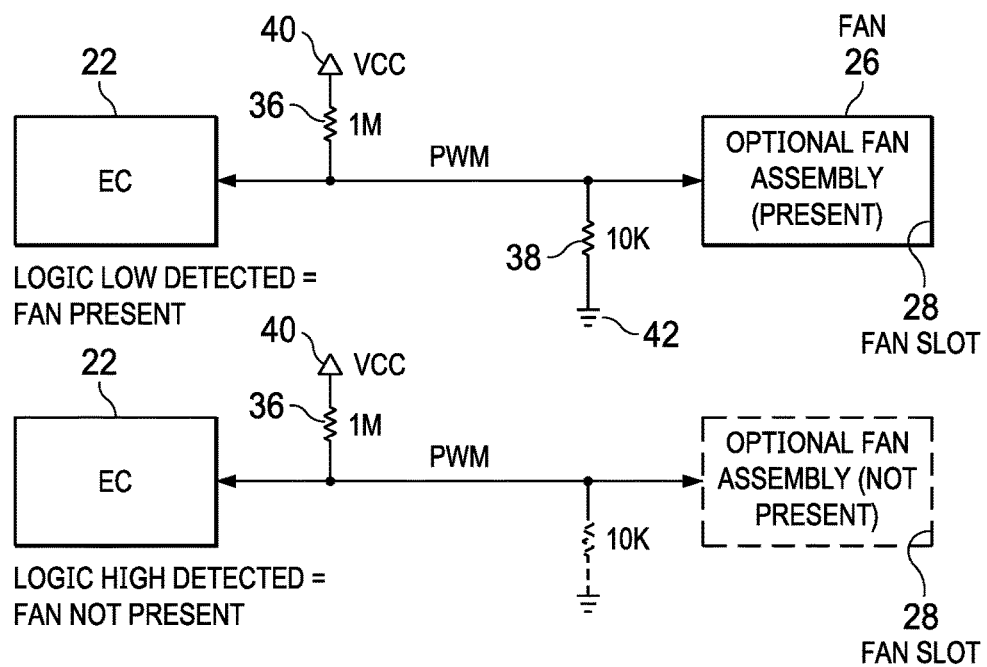
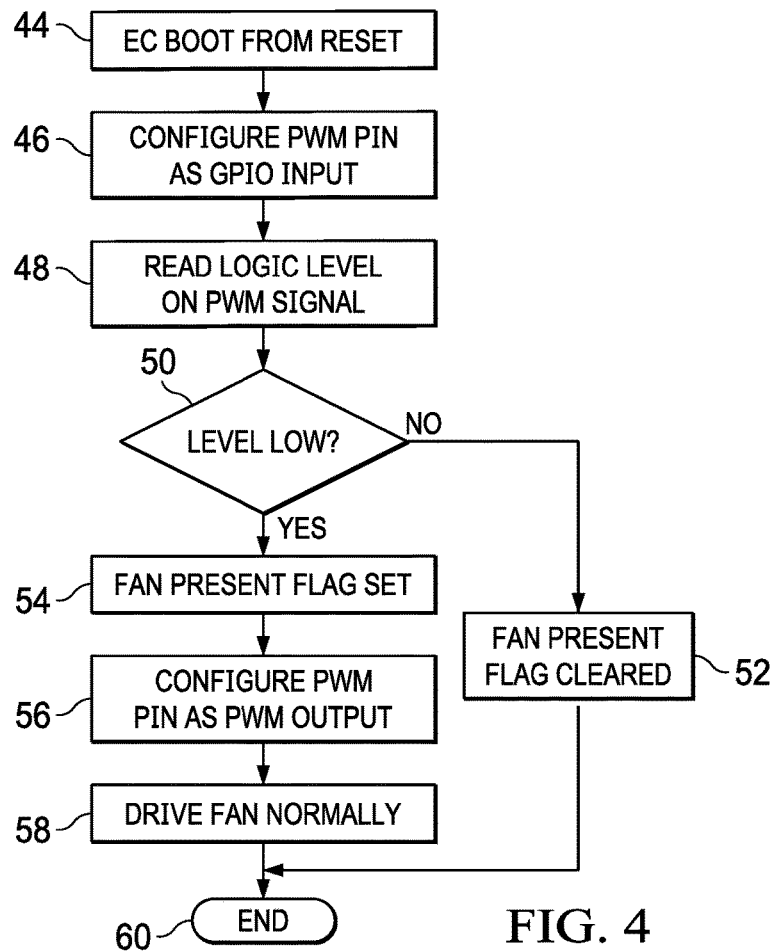

INFORMATION HANDLING SYSTEM OPTIONAL COMPONENT DETECTION AND MANAGEMENT

BACKGROUND OF THE INVENTION

Field of the Invention

The present invention relates in general to the field of information handling system component management, and more particularly to an information handling system optional component detection and management.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are built from a wide variety of components that cooperate to process information by dissipating power. Generally a central processing unit (CPU) and random access memory (RAM) execute instructions that respond to end user inputs and present information as visual images at a display. However, to properly interpret inputs and present output with a CPU and RAM, information handling systems typically include a wide variety of components that support power distribution, memory access, communications and thermal management, among other functions. Often, information handling system platforms are built with components having varied cost and capabilities to match different anticipated use cases. For example, a common information handling system platform might support different numbers of processors with different clock speeds and processing capabilities, different amounts of RAM, different sized storage devices, different sized power supplies, etc. Often, component pads and sockets are left unpopulated where a platform has a capability to support a component but the component is not included in the configuration. Typically, an information handling system maintains an inventory of key components, such as in system BIOS. In some instances, components are automatically detected and stored, such as from identification information included in each component. In other instances, components are manually included, such as at manufacture of the information handling system or during configuration following addition of a hardware component to the information handling system.

Typically, component management involves embedded code executing from flash memory on an embedded processor. For example, a keyboard controller often acts as a central component manager and reports component identifiers and status to the system BIOS or other firmware. In some cases, multiple embedded controllers, microcontrollers and/or integrated circuits will collectively act as an embedded controller that cooperates to manage hardware operations. Generally, embedded controllers monitor hardware devices by interfacing with the hardware devices through general purpose input/output (GPIO) pins. In some instances, standardized communication links, such as I2C and SPI communications links, provide logical interfaces, such as to provide identifier information. In other instances, dedicated GPIO pin interfaces provide direct communications between the embedded controller and managed devices. For example, an embedded controller might have a direct interface with a cooling fan pulse width modulation (PWM) output that commands cooling fan rotation speed and a second direct interface with a tachometer of the cooling fan to determine the cooling fan rotation speed. In various embodiments, the embedded controller directly controls fan speed based upon thermal conditions at the information handling system by sending PWM control signals to the cooling fan and reading tachometer signals provided from the cooling fan. In other embodiments, shared peripheral links, such as I2C or SPI links, may command cooling fan operations to a fan controller, with tachometer output provided through the fan controller or directly to the embedded controller.

As an example, optional cooling fans available in some information handling systems help to manage thermal conditions where additional components add capabilities, such as greater storage and memory components that generate thermal energy. In many ordinary operating conditions, optional cooling fans remain off or operate at a very low rotation rate. In one information handling system platform, the optional cooling fan tachometer output is provided to an embedded controller to monitor proper operation. Due to physical limitations on reading tachometer output, the embedded controller often cannot resolve very low RPM values. For example, the tachometer is basically an 8/16/32 bit timer measuring time between pulses so that, in order to have accuracy at high speeds with higher clock frequencies, lower rotation rates are not distinguishable, such as rotation below 92 RPM. At these low rotation rates, the embedded controller cannot distinguish between a lack of rotation versus a lack of an installed fan. One way to track the presence of the cooling fan is to set a sticky bit in flash memory when the cooling fan is installed, such as with manual input to the system BIOS. A difficulty with this approach is that the sticky bit must be manually removed if the fan is removed or the embedded controller may attempt to use the fan. If the sticky bit is inaccurate, errors will be presented to an end user that are difficult to track, debug and fix since the tachometer output may not be distinguishable by the embedded controller at low RPMs, so that errors reading tachometer output may in fact simply reflect indistinguishable outputs at the embedded controller.

SUMMARY OF THE INVENTION

Therefore, a need has arisen for a system and method which manages component detection and tracking with at an embedded controller.

In accordance with the present invention, a system and method are provided which substantially reduce the disadvantages and problems associated with previous methods and systems for component management at an embedded controller. An embedded controller pin selectively programs to either detect an interface with a component based upon the pin float to ground or a voltage source level or to communicate information with the pin. During operations in which information provided to the embedded controller by the component becomes indistinguishable, such as at low tachometer output from an optional cooling fan, the pin high to low state confirms whether or not the component is interfaced to the embedded controller, such as whether the component is presented or has been removed.

More specifically, an information handling system processes information with a processor and memory having operational conditions regulated by an embedded controller, such as with power and thermal management firmware stored in flash memory of the embedded controller. The embedded controller has plural pins, including at least one pin assigned to an optional component, such as a cooling fan that cools a persistent storage device, such as a first pin that command cooling fan operation with PWM signals and a second pin that receives tachometer readings from the cooling fan. At least one optional component pin receives information from the optional component if the optional component is present for a first portion of the optional component's operational range and fails to distinguish information in a second portion of the optional component's operational range, such as at low tachometer readings of an optional cooling fan. During operations of the optional component in the operational range that the embedded controller cannot distinguish, the presence of the component is confirmed with a read of the pin float driven high with a resistor and voltage source at the pin and pulled low with a ground interface at the component. If a low pin float is detected, then operation below the distinguishable range of the component is confirmed and an error is withheld. If a high pin float is detected, the component is determined not present and an error is issued in the event that information is expected at the pin, such as a tachometer reading in response to a PWM command for the optional cooling fan to run.

The present invention provides a number of important technical advantages. One example of an important technical advantage is that an optional device presence, such as a cooling fan, may be readily confirmed or denied in conditions where output from the device is not detected, such as at low RPM. Brief conversion of a GPIO that commands PWM to the cooling fan to instead read the pin as pulled high or low allows the embedded controller to confirm the presence of the optional cooling fan before issuing an error due to RPM output below a minimum value. Re-purposing of a GPIO in this manner reduces the total number of GPIO for a design to reduce costs and fully utilize all available GPIO in a GPIO constrained design. High impedance of the pull up and pull down resistors in the resistor divider circuit avoid interference with PWM commands to the cooling fan tachometer during normal operations and has minimal power consumption. The presence detection does not generally involve cooling fan hardware alterations as the cooling fan PWM line typically includes a pull down resistor to keep the PWM signal from floating. If an error does exist, such as the optional cooling fan becoming loose during operation, performing presence detect confirms the error to allow corrective action, such as thermal management with reduced power dissipation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 3 depicts an example of a resistor divider circuit that manages component detection at an embedded controller pin that reads information from the component in limited range; and FIG. 4 depicts a flow diagram of a process for managing optional component presence during operational conditions not distinguishable by an embedded controller.

DETAILED DESCRIPTION

An information handling system embedded controller detects component presence to manage error messages where the component operates in a range that provides feedback not distinguishable by the embedded controller, such as at low RPM. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
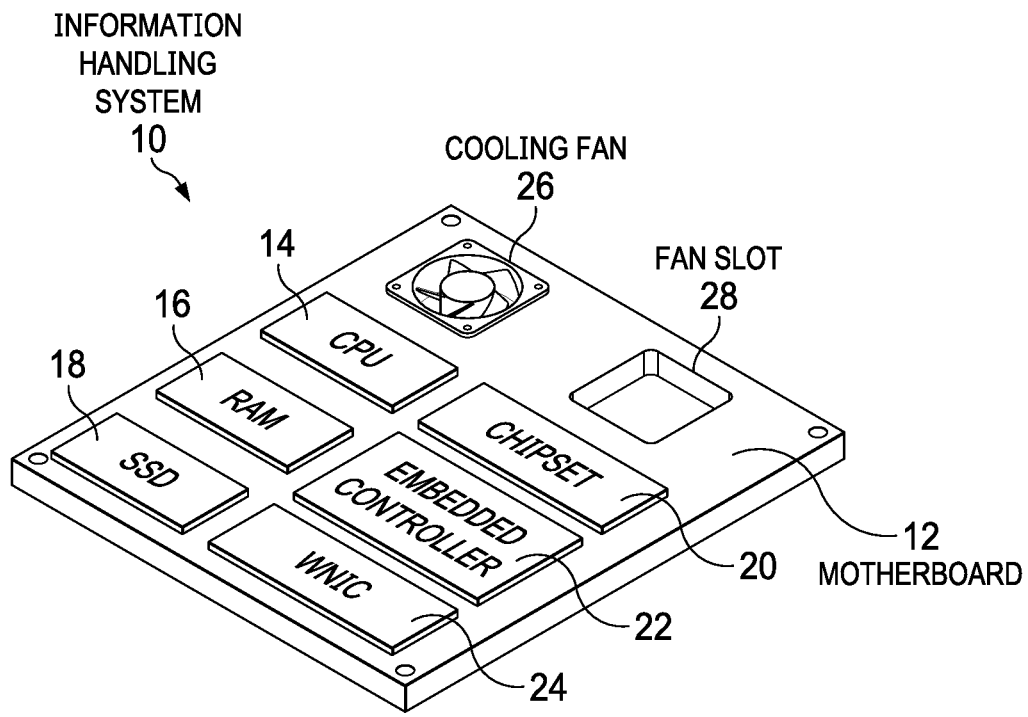
FIG. 1 depicts an information handling system having an embedded controller that manages optional components, such as a cooling fan that inserts into a fan slot.

Referring now to FIG. 1, an information handling system 10 is depicted having an embedded controller 22 that manages optional components, such as a cooling fan 26 that inserts into a fan slot 28. In the example embodiment, information handling system 10 has a motherboard 12 that interfaces processing components to process information. A central processing unit (CPU) 14 executes instructions to process information with the instructions and information stored in random access memory (RAM) 16. For example, instructions are provided from an operating system and/or applications stored in persistent memory, such as of a solid state drive (SSD) 18 or a hard disk drive (HDD). The processing components coordinate interactions under the control of a variety of hardware and firmware processing components within a chipset 20, such as to control memory access and communicate information across PCIE, I2C, SPI and other communication links. For example, a typical chipset includes a graphics processor that converts information provided from CPU 14 into pixel values for presentation at an external display, such as through an HDMI or DisplayPort interface. An embedded controller 22, such as a keyboard controller, manages interactions with external devices and peripherals as well as application of power. For example, embedded controller 22 executes pre-boot firmware code stored in flash memory that initiates system power up and boot, such as retrieval of operating system instructions from persistent memory. A wireless network interface card (WNIC) 24 provides wireless network communications with external devices, such as with a wireless local area network (WLAN) or Bluetooth interface. In various embodiments, information handling systems 10 may use different combinations of processing components in different forms, such as portable, desktop, server and other types of information handling system forms. In various embodiments, embedded controller 22 may be a variety of different types of processors or controllers as needed to ensure that system management functions have adequate processing resources. Embedded controller 22 interfaces with managed components through pins that interface with motherboard 12, such as through various sockets, like grid array sockets, or direct interfaces, like pads and contacts.

In the example embodiment, information handling system 10 includes an integrated cooling fan 26 and a fan slot 28 that accepts an optional cooling fan, such as when additional thermal transfer from information handling system 10 may be needed due to power dissipation by the processing components. For example, a second cooling fan 26 may be installed if an optional second CPU 14 is installed, if extra RAM 16 is installed or if a large storage device is installed, such as a hard disk drive. Generally, embedded controller 22 includes logic that manages thermal conditions at information handling system 10, such as by monitoring processing component temperature readings and cooling fan 26 operating conditions. In various embodiments, cooling fan 26 sets a cooling fan rotation speed based thermal conditions detected at a processing component and communicated to a controller of the cooling fan, such as with PWM commands from the embedded controller to the cooling fan. Alternatively, the integrated cooling fan 26 receives temperatures sensed at CPU 14 and adjusts cooling fan rotation speed to provide a cooling airflow that maintains thermal conditions associated with CPU 14 in defined constraints. In other embodiments, embedded controller 22 may receive detected thermal conditions and set a cooling fan speed, such as by sending commands through an I2C or SPI link. In each case, if cooling provided by cooling fans 26 become insufficient, thermal conditions are instead managed by reducing power dissipation, such as by throttling the speed at which CPU 14 operates. If cooling fan 26 fails to provide expected cooling or fails completely, an error message is typically generated so that the end user knows to perform maintenance, such as replacement of cooling fan 26. In some instances, cooling fan 26 provides direct feedback to embedded controller 22 that confirms its operation, such as by sending a tachometer output to a pin of embedded controller 22, which counts rotations with a timer. Embedded controller 22 uses tachometer feedback to confirm operation of cooling fan 26, such as by ensuring that detected fan speed matches commanded or expected fan speed.

In systems that have an optional cooling fan 26 installed in fan slot 28, feedback of the optional cooling fan tachometer provided to a pin of embedded controller 22 can be indistinguishable over a portion of the cooling fan's operational range. For example, constraints in embedded controller 22 timer memory and/or byte data sizes may limit measurements by the embedded controller of tachometer feedback to a range above a minimum RPM so that lower RPM values are not detected even though sent by the cooling fan to the embedded controller. In such instances, embedded controller 22 may throw an error related to thermal management since the expected feedback from the optional cooling fan of a rotation speed below the detectable rotation speed is not received at the embedded controller pin. For example, an error that the optional fan 26 is missing from the fan slot 28 may be provided even though the optional fan 26 is present and providing accurate tachometer feedback below a range detectable by the embedded controller. Further, because the optional fan may in fact have been removed, the error may be correct and cannot be ignored. Although the example embodiment describes the problem as related to an optional fan installation, in alternative embodiments, alternate optional hardware devices may present a similar problem.

Figure 2:
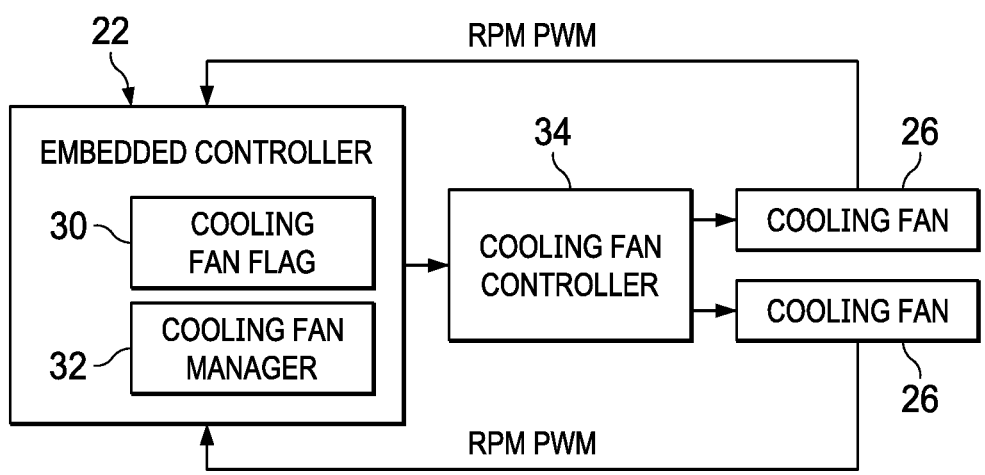
FIG. 2 depicts a block diagram of embedded controller logic that tracks optional component presence during operational conditions not distinguishable by the embedded controller.

Referring now to FIG. 2, a block diagram depicts embedded controller logic that tracks optional component presence during operational conditions not distinguishable by the embedded controller. In the example embodiment, embedded controller 22 includes a cooling fan flag 30 that stores whether a cooling fan 26 is present for each pin of embedded controller 22 that is assigned to cooling fan operations. A cooling fan manager 32 reads the flag 30 to determine whether to send PWM commands to each cooling fan pin and whether to expect tachometer feedback from each cooling fan pin. For example, in the example embodiment, each cooling fan 26 interfaces with first and second pins of embedded controller 22 to receive PWM commands to set the cooling fan speed and tachometer output to read the cooling fan speed that results from the PWM command. A cooling fan controller 34 may also be present to manage cooling fan operations, such as setting fan speeds with I2C commands from the cooling fan manager. Generally, each cooling fan 26 has at least one direct pin connection with embedded controller 22 so that cooling fan manager 32 can confirm cooling fan operations. A common configuration is a separate PWM and tachometer pin for each cooling fan 26, however, in alternative embodiments various types of interfaces may be used to support embedded controller interactions, such as a GPIO expander.

In the example embodiment, cooling fan manager 32 commands cooling fan speeds with PWM pulses and then compares the commanded speed with feedback provided by a tachometer reading of the associated cooling fan. If the cooling fan 26 fails to provide feedback, cooling fan manager checks to see if a cooling fan flag 30 is set for the cooling fan and withholds issuing an error if a flag is set for the cooling fan and the expected speed falls below a detectable tachometer reading. If the cooling fan is not present, an error is issued since the embedded controller is inaccurately sending cooling fan operational commands without a cooling response to the thermal conditions. In one embodiment, when cooling fan manager 32 detects an error due to failure to read tachometer from a cooling fan, cooling fan manager 32 converts the PWM pin of the cooling fan to read whether the cooling fan is present, then reconverts the PWM pin to send PWM commands. If the PWM pin is present in the absence of a tachometer feedback, an error message is withheld, such as by comparing the expected tachometer feedback against the commanded fan speed to determine that the range of operations falls below a detection threshold of the embedded controller. In an alternative embodiment, presence of the cooling fan is detected at startup of the system, such as at POST, and stored as a flag until a next startup check. In another alternative embodiment, a tachometer pin is used to detect cooling fan presence instead of a PWM pin. For example, cooling fan controller 34 disconnects the tachometer output to let the tachometer pin float and embedded controller 22 reads the float value to determine if a connection exists. Alternatively, the tachometer pin is changed to a simple read and held for a time to determine if any change occurs in pin value. Although tachometer input to a controller can be used to detect presence, care is needed to ensure that the resistor divider circuit does not impact operation of the GPIO as an input, and this will increase cost and complexity. Advantageously, using the PWM pin to read cooling fan presence converts the GPIO from an output to an input that will float to the same neutral value each time.

Referring now to FIG. 3, an example resistor divider circuit is depicted that manages component detection at an embedded controller pin that reads information from the component in limited range. In the example embodiment, an embedded controller 22 outputs PWM commands to a cooling fan 26 through a motherboard trace interfaced with a GPIO pin of embedded controller 22. At the embedded controller side, a 1 MOhm resistor 36 is disposed between a Vcc 40 voltage source and the trace to pull the trace high in the absence of other interfaces. At cooling fan 26 inserted in fan slot 28, a smaller 10 KOhm resistor is disposed between the trace and ground 42 to bias the trace low. When cooling fan 26 is present, the interface with ground is established to form a 100:1 resistor divider ratio so that the smaller resistor pulls the trace to ground. If fan 26 is removed from fan slot 28, no interface to ground exists so that the trace biases to a logical high. The 100:1 ratio of resistances at Vcc and ground will provide a V min and V max for a logical one or zero with good reliability to allow accurate and rapid detection of device presence. For example, a voltage divider formula to calculate voltage at the GPIO pin provides:

$$V(GPIO)=V(CC)*(R38)/(R38+R36)$$

Replacing the 10 KOhm and 1 MOhm values for a 3.3V Vcc provides:

$$V(GPIO)=3.3V*(10E3/(1E6+10E3)=0.0327V$$

The relatively low value of 0.0327V produces a low logic signal when the optional cooling interfaces the 10 KOhm resister 38 to create the dual resistor circuit. The 100:1 ratio safely provides a logic low, while a resistor ratio of 10:1 outputs 0.3V to the GPIO pin, which could generate a logic high in some instances as an error. The dual resistor setup, as opposed to a single resistor presence detection circuit, allows for both a definitive high and low logic state. Without a device connected, the 1 MOhm resistor pulls high; if a device is present, the 10 KOhm resistor pulls low to override the high signal provided from Vcc through the 1 MOhm resistor. Having both the 1 MOhm and 10 KOhm resistors present during fan operation does not adversely impact the PWM output operation since the PWM driver mode overrides both the 1 MOhm and 10 KOhm resistors.

At any point in time during normal operations, embedded controller 22 programmatically adapts the PWM pin from outputting PWM commands to instead read whether the pin is floating high or low. If low, the cooling fan is present and the tachometer reading may be below the threshold that is detectable by the embedded controller. If high, the cooling fan is absent and the expectation of a tachometer reading is in error that should be reported to the end user. If the pin is low so that the cooling fan is present, tachometer feedback can be relied upon for fan failure detection when a PWM output does not yield the expected tachometer value input at the embedded controller so that a disambiguation is provided between the conditions of missing tachometer readings due to fan failure versus a missing fan assembly. The relatively high impedances of current through the pins provides minimal power consumption. In an alternative embodiment, the voltage source may be provided at the cooling fan and the ground at the embedded controller to reverse the logic high/low for optional cooling fan presence by reversing the positions of the 1 MOhm and 10 KOhm resistors. Further, the resistor divider circuit may interface with a tachometer pin instead of the PWM pin.

Referring now to FIG. 4, a flow diagram depicts a process for managing optional component presence during operational conditions not distinguishable by an embedded controller. The process starts at step 44 with an embedded controller boot from a reset, such as during POST of an information handling system. At step 46, the PWM pin of the embedded controller is configured as a GPIO input. At step 48, the embedded controller performs a logic read of the PWM pin signal at the pin to determine if a low or high logic state exists. If at step 50 a logic low is not detected, the process continues to step 52 to clear the fan present flag and the process ends at step 60 with the embedded controller programmed that the optional cooling fan is not installed. In one embodiment, the PWM pin remains in read and is periodically read to detect if a fan is installed. If at step 50 a low logic is read at the embedded controller PWM pin, the process continues to step 54 to set the fan present flag. At step 56 the PWM pin is configured as a PWM output to command cooling fan rotations so that the embedded controller thermal logic can manage the thermal state with the optional cooling fan present. At step 58 the cooling fan is driven normally with PWM signals and the process ends at step 60. In one alternative embodiment, steps 46 through 58 may be repeated if an error arises due to a failure of the embedded controller to receive an expected tachometer signal.

Although the present invention has been described in detail, it should be understood that various changes, substitutions and alterations can be made hereto without departing from the spirit and scope of the invention as defined by the appended claims.

What is claimed is:

1. An information handling system comprising:
   a circuit board;
   a processor disposed on the circuit board and operable to process information with instructions;
   a memory interfaced with the processor through the circuit board and operable to store the information and instructions;
   an embedded controller interfaced with the processor through the circuit board and having plural pins electrically coupled to the circuit board, at least one of the plural pins interfaced with a socket configured to accept a component, the embedded controller configured to receive information from the component over only a portion of an operating range of the component; and
   a resistor divider circuit distributed between the circuit board and the component to provide a first pin value if the component couples to the socket and a second pin value if the component does not couple to the socket;
   wherein the embedded controller configures to read the pin value to analyze whether faults are associated with the component when the component operates outside the portion of the operating range.

2. The information handling system of claim 1 wherein the resistor divider circuit further comprises:
   a first resistance to a voltage source at the circuit board; and
   a second resistance to ground at the component, the first resistance greater than the second resistance so that a logic low is provided to the pin if the component is present and a logic high is presented to the pin if the component is absent.

3. The information handling system of claim 2 wherein the component comprises a cooling fan.

4. The information handling system of claim 3 wherein the operating range of the cooling fan comprises a range of tachometer readings.

5. The information handling system of claim 1 wherein the resistor divider circuit further comprises:
   a first resistance to a voltage source at the component; and
   a second resistance to ground at the circuit board, the first resistance less than the second resistance so that a logic low is provided to the pin if the component is absent and a logic high is presented if the component is present.

6. The information handling system of claim 1 wherein the embedded controller further selectively configures to read the pin value during operation of the component.

7. The information handling system of claim 6 wherein the embedded controller detects an error if the component operates outside the portion of the operating range and, in response, configures the pin to read whether the component is present, the embedded controller withholding an error report if the component is present.

8. The information handling system of claim 7 wherein the component comprises an optional cooling fan.

9. The information handling system of claim 8 wherein the portion of the operating range comprises cooling fan speeds below a predetermined rotation speed.

10. A method for managing information handling system components, the method comprising:
    detecting a failure at an embedded controller to receive information from a component, the component having an operating range with a first portion readable by the embedded controller and a second portion not readable by the embedded controller;
    in response to the detecting, reading whether a pin interfaced with the embedded controller is high or low;
    determining normal component operation in the second portion of the operating range if the pin is low; and
    issuing an error if the pin is high.

11. The method of claim 10 further comprising:
    interfacing a voltage source through a first resistor to the pin proximate the embedded controller; and
    interfacing a ground through a second resistor proximate the component, the ground interfacing with the pin when the component interfaces with the pin;
    wherein the first resistor has greater resistance than the second resistor so that the pin floats to low when the component is connected and to high when the component is disconnected.

12. The method of claim 11 wherein detecting a failure further comprises:
    detecting the pin high at power up of the information handling system;
    detecting a command to the component; and
    failing to receive feedback from the component associated with the command at the pin.

13. The method of claim 12 wherein the failure further comprises output of the feedback from the component below a detection threshold of the embedded controller.

14. The method of claim 13 wherein the component comprises an optional cooling fan.

15. The method of claim 14 wherein the feedback comprises a tachometer providing fan speed.

16. An information handling system component manager comprising:
    an embedded controller having plural pins and operable to execute instructions;
    non-transitory memory interfaced with the embedded controller and operable to store the instructions; and
    instructions stored in the non-transitory memory that when executed on the embedded controller:
    detect at system start a high or low value at a predetermined pin;
    if low, store that a predetermined component is interfaced with the pin;
    if high, store that the pin is unused; and
    withhold issuing an error if the predetermined component is interfaced and fails to provide an expected feedback of less than a predetermined threshold.

17. The component manager of claim 16 wherein:
    the predetermined component comprises an optional cooling fan; and
    the expected feedback comprises a tachometer reading of less than a predetermined value.

18. The component manager of claim 17 wherein the instructions:
    if the expected feedback is less than a predetermined threshold, check if the predetermined pin is high or low; and
    if the pin is high, issue the error.

19. The component manager of claim 16 wherein the instructions check if the pin is high or low at each error associated with the component.

20. The component manager of claim 16 wherein the component comprises a cooling fan associated with cooling a persistent storage device.

* * * * *